(12) United States Patent
Iizuka et al.

(10) Patent No.: US 10,180,501 B2
(45) Date of Patent: Jan. 15, 2019

(54) RADIATION DETECTOR

(71) Applicant: Sharp Kabushiki Kaisha, Sakai, Osaka (JP)

(72) Inventors: Kunihiko Iizuka, Sakai (JP); Shigenari Taguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 96 days.

(21) Appl. No.: 15/528,108

(22) PCT Filed: Sep. 7, 2015

(86) PCT No.: PCT/JP2015/075308
§ 371 (c)(1),
(2) Date: May 19, 2017

(87) PCT Pub. No.: WO2016/084454
PCT Pub. Date: Jun. 2, 2016

(65) Prior Publication Data
US 2017/0307764 A1    Oct. 26, 2017

(30) Foreign Application Priority Data
Nov. 27, 2014 (JP) .................... 2014-240516

(51) Int. Cl.
*G01T 1/20* (2006.01)
*H04N 5/378* (2011.01)
(Continued)

(52) U.S. Cl.
CPC .............. *G01T 1/20* (2013.01); *H01L 27/146* (2013.01); *H04N 5/32* (2013.01); *H04N 5/363* (2013.01); *H04N 5/3655* (2013.01); *H04N 5/378* (2013.01)

(58) Field of Classification Search
CPC .......... G01T 1/20; H01L 27/146; H04N 5/32; H04N 5/363; H04N 5/3655; H04N 5/378
See application file for complete search history.

(56) References Cited

U.S. PATENT DOCUMENTS 6,777,660 B1    8/2004  Lee
2010/0271522 A1*  10/2010  Matsunaga ......... H04N 5/2176
                                                            348/302
(Continued)

FOREIGN PATENT DOCUMENTS

EP    2 362 640 A1    8/2011
JP    2007-282684 A   11/2007
(Continued)

OTHER PUBLICATIONS

Karim et al., "Amorphous Silicon Active Pixel Sensor Readout Circuit for Digital Imaging", IEEE Transactions on Electron Devices, vol. 50, No. 1, Jan. 2003, pp. 200-208.
(Continued)

*Primary Examiner* — Mark R Gaworecki
(74) *Attorney, Agent, or Firm* — Keating & Bennett, LLP

(57) ABSTRACT

A radiation detector (radiation sensor 1) includes a sensor element (3) and an amplifying transistor (5), reads a current value that flows between the drain and the source based on a change in voltage of a gate electrode of the amplifying transistor (5), and also includes a reset reading circuit (10) that includes an amplifier (11) and reads the current value, and the reset reading circuit (10) outputs an initial voltage to the gate electrode so that the current value becomes a value that is determined in advance.

6 Claims, 9 Drawing Sheets

(51) Int. Cl.
*H04N 5/32* (2006.01)
*H01L 27/146* (2006.01)
*H04N 5/365* (2011.01)
*H04N 5/363* (2011.01)

(56) References Cited

U.S. PATENT DOCUMENTS

| | | |
|---|---|---|
| 2011/0108735 A1 | 5/2011 | Ruetten et al. |
| 2011/0199106 A1 | 8/2011 | Lotto et al. |
| 2012/0200752 A1 | 8/2012 | Matsunaga |
| 2013/0335610 A1 | 12/2013 | Yamada |

FOREIGN PATENT DOCUMENTS

| | | |
|---|---|---|
| JP | 2011-166792 A | 8/2011 |
| JP | 2014-060725 A | 4/2014 |
| WO | 2012/043867 A1 | 4/2012 |

OTHER PUBLICATIONS

Karim et al., "Readout Circuit in Active Pixel Sensors in Amorphous Silicon Technology", IEEE Electron Device Letters, vol. 22, No. 10, Oct. 2001, pp. 469-471.

\* cited by examiner

RADIATION DETECTOR

TECHNICAL FIELD

The present invention relates to a radiation detector, in particular, relates to an X-ray detector, and more specifically relates to a technique for realizing a radiation detection panel provided with an X-ray detection function having high sensitivity.

BACKGROUND ART

As sensor elements that output an electrical signal corresponding to a radiation dose of incident radiation, in particular, X-rays, a direct conversion type that directly converts X-rays into an electrical signal and an indirect conversion type that converts X-rays into light by using a scintillator and then the light is converted into an electrical signal by using a photoelectric conversion element have been used. X-ray image capturing panels in which such sensor element is provided for each pixel of a plurality of pixels disposed in two-dimensional matrix form on a substrate (a panel) have been developed. In such panels, thin film transistor elements (TFT elements) are used for the control of each pixel. Further, in both the direct conversion type and the indirect conversion type, an electrical signal (an electric charge) generated corresponding to the radiation dose of X-rays is accumulated in a capacitance inside each pixel.

A detector that transfers electrical signals accumulated in the capacitances to an amplifier, which is outside the panel, via the TFT elements is referred to as a detector of a passive pixel type, and is already put into practical use in a broad range of digital X-ray image capturing devices.

Meanwhile, as described in PTL 1, NPL 1, and NPL 2, a detector referred to as an active pixel type that amplifies, by using the TFT elements as amplification elements, capacitance in which electrical signals are accumulated and transmits the capacitance to an external circuit has been developed, because it is possible to mitigate effects of thermal noise of reading lines and noise of external reading circuits.

FIG. 9 is a view that illustrates an example of an active pixel 101 and a reading circuit 102 provided in an active pixel type radiation detector 100 of the related art.

As illustrated, Vs_b, which is a bias voltage of a sensor element 103, is applied to an end of the sensor element 103 in the active pixel 101. Further, when X-rays are incident on the active pixel 101, an electrical signal is generated by the sensor element 103, and the voltage of a gate electrode of an amplifying transistor 105 connected to the sensor element 103 changes. This is because the generated electrical signal is accumulated in an electrostatic capacitance connected to the gate electrode of the amplifying transistor 105.

The amplifying transistor 105 outputs the change in the gate voltage that arises due to the generated electrical signal as a current change between the drain and the source. The amplifying transistor 105 is a transistor that amplifies the electrical signal, and the power source voltage thereof is Vd.

A reset transistor 104 controls an electrical connection state or an interruption state of the gate electrode of the amplifying transistor 105 and a reset voltage Vd applied from outside the active pixel 101 on the basis of a reset signal supplied via a reset signal line 109.

A reading transistor 106 is a switch for outputting a drain-source current of the amplifying transistor 105 to outside the active pixel 101, and is controlled on the basis of a reading signal supplied via a reading signal line 108.

Further, the drain-source current of the amplifying transistor 105, which is output to outside the active pixel 101, is read by the reading circuit 102, which is provided with an integration amplifier 107, and a capacitance Cf110 connected between a minus input terminal of the integration amplifier 107 and an output terminal of the integration amplifier 107, and the reading circuit 102 outputs an output voltage Vo111.

CITATION LIST

Patent Literature

PTL 1: Japanese Unexamined Patent Application Publication No. 2014-60725 (Apr. 3, 2014)

Non Patent Literature

NPL 1: K. S. Karim, et al., "Readout Circuit in Active Pixel Sensors in Amorphous Silicon Technology," IEEE Electron, Device Letters, Vol. 22, No. 10, October 2001.

NPL 2: K. S. Karim, et. al, "Amorphous Silicon Active Pixel Sensor Readout Circuit for Digital Imaging," IEEE TRANSACTIONS ON ELECTRON DEVICES, VOL. 50, NO. 1, January 2003

SUMMARY OF INVENTION

Technical Problem

However, in the active pixel type radiation detector 100 of the related art, a threshold voltage and the mobility of the amplifying transistor 105 may vary in a single active pixel 101 or between a plurality of active pixels 101. In this case, if an initial value of the gate voltage of the amplifying transistor 105 is uniformly determined, the initial value of the drain-source current of the amplifying transistor 105, which is output to outside of the active pixel 101, may vary. Accordingly, it is not possible to accurately estimate the amperage between the drain and the source of the amplifying transistor 105, which fluctuates depending on the electrostatic capacitance where the electrical signal generated by the sensor element 103 is accumulated after the radiation being incident on the active pixel 101.

It is possible to correct variation in an initial current value by measuring the initial current value between the drain and the source of the amplifying transistor 105 and obtaining a difference between the initial current value and a current value after the incidence of radiation. However, in a case where an obtained initial current value is large, flicker noise is increased, and it is not possible to obtain a desired S/N ratio (Signal/Noise ratio). In addition, in a case where an obtained initial current value is saturated as a result of being excessively high, there is a problem in that it may not be possible to detect an output signal (an output current), or the like. On the other hand, in a case where an obtained initial current value is too small, an amplification factor of the amplifying transistor 105 is also small, and therefore, there is a possibility that this will lead to a decrease in the S/N ratio, and there is a problem in that it may not be possible to obtain a desired output signal.

The present invention was devised in light of the above-mentioned technical problems, and an object thereof is to provide a radiation detector that is able to obtain an output signal in which a desired S/N ratio is retained even in a case where the threshold voltage and the mobility of an amplifying transistor are varied.

Solution to Problem

In order to solve the above-mentioned technical problem, a radiation detector according to an aspect of the present invention includes a sensor element that causes an electrical signal to be generated based on a radiation dose of incident radiation, and an amplifying transistor that amplifies the electrical signal, the radiation detector reading a current value that flows between a source electrode and a drain electrode of the amplifying transistor based on a change, due to the electrical signal, in voltage of a gate electrode of the amplifying transistor. The radiation detector also includes a reset reading circuit that includes an amplifier and reads the current value using the amplifier, and the reset reading circuit outputs an initial voltage to the gate electrode so that the current value becomes a value that is determined in advance.

Advantageous Effects of Invention

According to the aspect of the invention, it is possible to realize a radiation detector that can obtain an output signal in which a desired S/N ratio is retained even in a case where the threshold voltage and the mobility of an amplifying transistor are varied.

DESCRIPTION OF EMBODIMENTS

Hereinafter, embodiments of the present invention will be described in detail. For convenience of description, the same reference symbols will be given to members having the same functions as members described earlier embodiments, and description thereof will be omitted.

Embodiment 1

Embodiment 1 of the present invention will be described with reference to FIG. 1. However, the dimensions, materials, shapes, relative disposition, processing techniques, and the like, of the configurations indicated in the embodiment are merely one embodiment, and the range of the invention should not be interpreted in a limited manner based on these. Furthermore, the drawings are schematic, and the ratios and shapes of the dimensions thereof may differ from those in practice.

[Schematic Configuration of Radiation Sensor]

Figure 1:
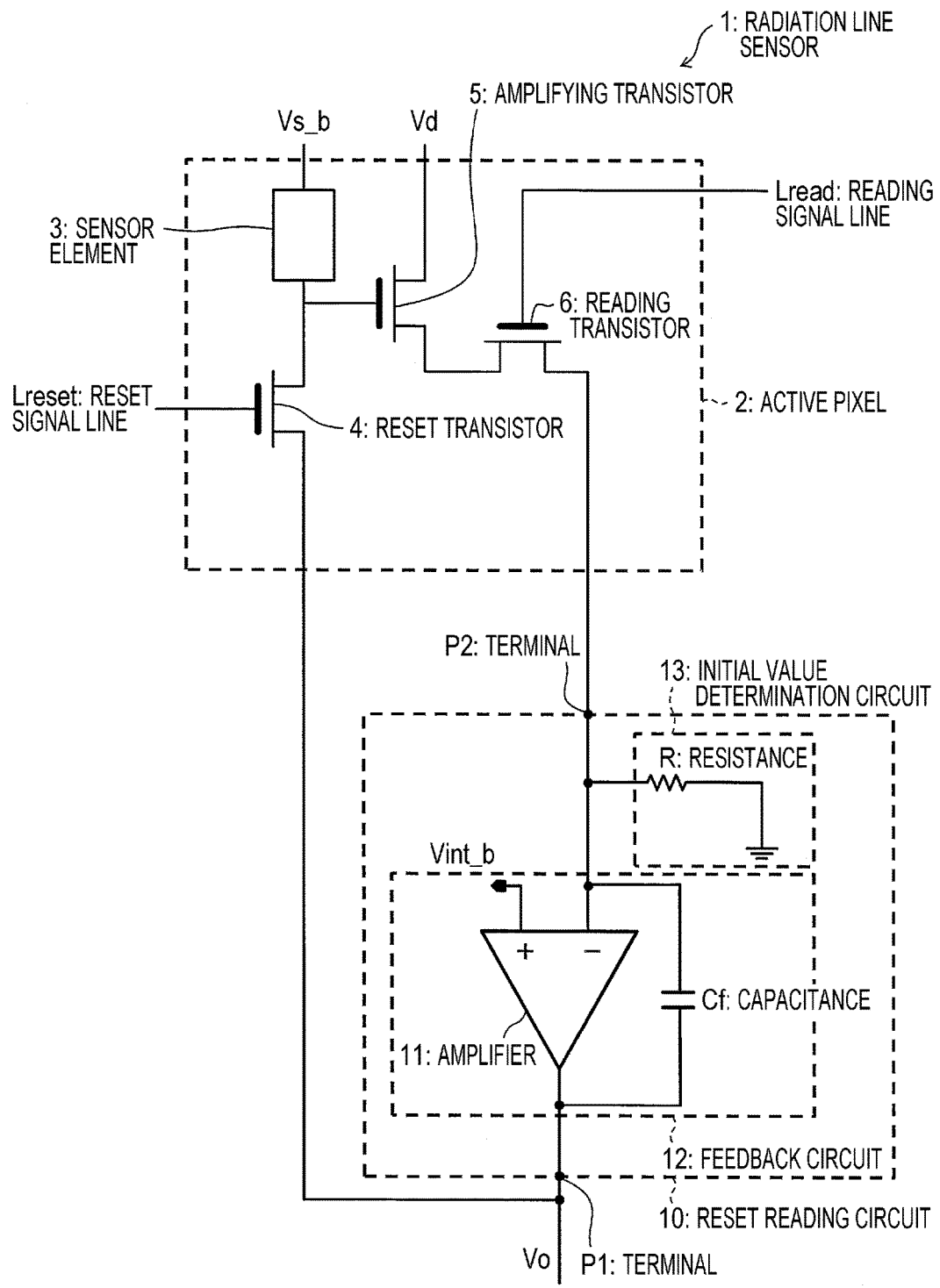
FIG. 1 is a view illustrating a schematic circuit configuration of a radiation sensor according to Embodiment 1 of the present invention.

FIG. 1 is a view illustrating a schematic circuit configuration of a radiation sensor 1 according to Embodiment 1 of the present invention.

The radiation sensor 1 (a radiation detector) is a sensor that senses the presence or absence of radiation and the intensity of radiation, and as illustrated in FIG. 1, includes an active pixel 2 and a reset reading circuit 10.

In the present embodiment, description will be given with the radiation sensor 1 set as a direct conversion type that directly converts incident radiation into an electrical signal, but the invention is not limited to this configuration. The radiation sensor 1 may also be an indirect conversion type that performs conversion into an electrical signal by using a photoelectric conversion element after converting incident radiation into light by using a scintillator, or the like.

[Active Pixel]

The active pixel 2 (pixel) outputs a current corresponding to the radiation dose of incident radiation to the reset reading circuit 10, which will be mentioned later. Thin Film Transistors (TFTs) are used in the control of the active pixel 2. The active pixel 2 includes a sensor element 3, a reset transistor 4, an amplifying transistor 5, and a reading transistor 6.

The sensor element 3 is an element that directly converts radiation into an electrical signal (an electric charge of a hole). In other words, the sensor element 3 generates an electrical signal corresponding to the radiation dose of incident radiation (generates an electrical signal). An output end of the sensor element 3 is connected to a gate electrode of the amplifying transistor 5 and a drain electrode of the reset transistor 4. An input end of the sensor element 3 is connected to a bias power source (not illustrated in the drawings). A bias voltage Vs_b is applied to the input end of the sensor element 3 from the bias power source.

When radiation is incident on the sensor element 3, an electrical signal corresponding to the radiation dose of incident radiation is output from the sensor element 3, and a voltage applied to the gate electrode of the amplifying transistor 5, which is connected to the output end of the sensor element 3, fluctuates. The reason for this is that an electrical signal output from the sensor element 3 is accumulated in an electrostatic capacitance between the gate electrode of the amplifying transistor 5 and the bias voltage Vs_b. The electrostatic capacitance between the gate electrode of the amplifying transistor 5 and the bias voltage Vs_b is formed by using a parasitic capacitance of the gate electrode of the amplifying transistor 5 and capacitances between the input and output terminals of the sensor element 3, or the like.

In a case where the sensor element 3 is an indirect conversion type, light converted from incident radiation is converted into an electrical signal by using the scintillator.

The reset transistor 4 controls an electrical connection state or an interruption state of the gate electrode of the amplifying transistor 5 and a reset voltage applied from outside the active pixel 2 on the basis of a reset signal supplied via a reset signal line Lreset.

The source electrode of the reset transistor 4 is connected to the output end of the reset reading circuit 10. The gate electrode of the reset transistor 4 is connected to the reset signal line Lreset, and the reset transistor 4 is turned on when the reset signal from the reset signal line Lreset is High.

The amplifying transistor 5 is a transistor that increases the electrical signal generated by the sensor element 3, and outputs a change in the voltage of a gate voltage of the amplifying transistor 5, which arises due to the electrical signal, as a drain-source current of the amplifying transistor 5.

The drain electrode of the amplifying transistor 5 is connected to the source electrode of the reading transistor 6. The source electrode of the amplifying transistor 5 is connected to a power source (not illustrated in the drawings) of the amplifying transistor 5. A power source voltage Vd is applied to the source electrode of the amplifying transistor 5 from the power source of the amplifying transistor 5.

The reading transistor 6 is a switch for outputting an output current of the amplifying transistor 5 to outside the active pixel 2.

The drain electrode of the reading transistor 6 is connected to the input end of the reset reading circuit 10, which will be mentioned later. The gate electrode of the reading transistor 6 is connected to a reading signal line Lread, and the reading transistor 6 is turned on when a signal from the reading signal line Lread is High.

In this instance, in order to cause the amplifying transistor 5 to operate by using a suitable signal amplification factor, for the following reasons, it is necessary to initialize (reset) the gate voltage, which is applied to the gate electrode of the amplifying transistor 5, to a suitable voltage, and set an initial current value, which flows between the source electrode and the drain electrode of the amplifying transistor 5 to be within an appropriate range.

For example, in a case where the amplifying transistor 5 is an N-type transistor, when the gate voltage is excessively high, the current value that flows between the source electrode and the drain electrode of the amplifying transistor 5 is excessively high, and therefore, there is a possibility that an output voltage Vo that the reset reading circuit 10, which will be mentioned later, reads will be saturated. In addition, there is a possibility that an excessively large current will lead to an increase in noise, and therefore, will be linked with a decrease in the S/N ratio.

On the other hand, if the gate voltage is excessively low, there is a possibility that the gate voltage will fall below a threshold value, and therefore, a current will not flow between the drain and the source of the amplifying transistor 5. In addition, there is a possibility that an excessively small current will be linked with a decrease in the S/N ratio due to a decrease in amplification factor.

A suitable initial voltage of the gate electrode of the gate voltage of the amplifying transistor 5 (gate voltage of the amplifying transistor 5 when the gate electrode of the amplifying transistor 5 is initialized) fluctuates depending on a threshold value of the transistor. Therefore, even if a predetermined voltage that is fixed in advance is set as the initial voltage of the gate voltage, it is not possible to suitably initialize the gate voltage of the amplifying transistor 5.

In this instance, since the amplification factor of the amplifying transistor 5 is a function of the output current from the amplifying transistor 5, it is possible to control the amplification factor of the amplifying transistor 5 to a suitable value by determining the output current from the amplifying transistor 5.

In other words, in order to initialize the gate voltage of the amplifying transistor 5 to a suitable voltage, it is sufficient as long as the initial voltage of the gate voltage of the amplifying transistor 5 is determined so that the drain-source current of the amplifying transistor 5 becomes a constant current value that is determined in advance.

[Reset Reading Circuit]

The reset reading circuit 10 reads an output current value from the amplifying transistor 5 (a current value that flows between the source electrode and the drain electrode of the amplifying transistor 5), which arises due to a change in the voltage of the gate electrode of the amplifying transistor 5. In addition, the reset reading circuit 10 outputs the initial voltage to the gate electrode of the amplifying transistor 5 so that the current value between the drain and the source becomes a constant value that is determined in advance.

The reset reading circuit 10 includes a feedback circuit 12 and an initial value determination circuit 13. Furthermore, the reset reading circuit 10 includes a terminal P1 for outputting the initial voltage and the read output voltage Vo to the gate electrode of the amplifying transistor 5 of the active pixel 2, and a terminal P2 for receiving the output current from the active pixel 2.

The feedback circuit 12 integrates the output current value from the amplifying transistor 5, which arises due to a change in voltage of the gate electrode of the amplifying transistor 5. In addition, the feedback circuit 12 generates an initial value (the initial voltage) of the voltage of the gate electrode of the amplifying transistor 5 using feedback control so that the output current value from the amplifying transistor 5 becomes a current value that is determined in advance by a reference voltage Vint_b input to a plus side input terminal of an amplifier 11 and a resistance R in the initial value determination circuit 13. The feedback circuit 12 includes the amplifier 11 and a capacitance Cf.

The plus side input terminal of the amplifier 11 is connected to the reference voltage Vint_b. A minus side input terminal of the amplifier 11 is connected to the drain electrode of the amplifying transistor 5 via the reading transistor 6 of the active pixel 2, and is connected to the initial value determination circuit 13. The output of the amplifier 11 is connected to the gate electrode of the amplifying transistor 5 via the reset transistor 4, and is connected to a terminal that outputs the output voltage Vo.

The minus side input terminal and the output terminal of the amplifier 11 configure the feedback circuit 12 as a result of being connected via the capacitance Cf.

During a reset operation of the radiation sensor 1, which will be mentioned later, the output of the amplifier 11 is fed back to the minus side input terminal of the amplifier 11, and due to this feedback, the initial voltage of the voltage of the gate electrode of the amplifying transistor 5 is generated (set) by the output of the amplifier 11.

The initial value determination circuit 13 determines the initial value of the current output from the amplifying transistor 5. The initial value determination circuit 13 includes the resistance R. The resistance R is connected to ground. The initial value determination circuit 13 is connected to the drain electrode of the amplifying transistor 5 via the reading transistor 6 of the active pixel 2, and is connected to the minus side input terminal of the amplifier 11.

[Operation of Radiation Sensor]

Next, an operation of the radiation sensor 1 will be described divided into a reset operation, a radiation sensing operation, and a reading operation.

In this instance, the configuration of the radiation sensor 1 will be rearranged. The radiation sensor 1 includes the sensor element 3 that generates an electrical signal based on a radiation dose of incident radiation and the amplifying transistor 5 that amplifies the electrical signal, and is a radiation detector that reads a current value that flows between the source electrode and the drain electrode of the amplifying transistor 5 based on a change in voltage of the gate electrode of the amplifying transistor 5, which arises due to the electrical signal, and also includes the reset reading circuit 10 that includes the amplifier 11 and reads the current value using the amplifier 11, and the reset reading circuit 10 outputs the initial voltage to the gate electrode so that the current value becomes a value that is determined in advance.

[Reset Operation]

In the reset operation, the reset reading circuit 10 resets (initializes) the gate voltage of the amplifying transistor 5 by setting the initial voltage of the gate electrode of the amplifying transistor 5 so that the drain-source current of the amplifying transistor 5 becomes a value that is determined in advance. In the reset operation, the reset transistor 4 and the reading transistor 6 are turned on.

When the reset transistor 4 and the reading transistor 6 are both turned on, due to the feedback of the amplifier 11, the voltage of the minus side input terminal of the amplifier 11 becomes the same Vint_b as the plus side input terminal. Therefore, a current Vint_b/R flows to ground from between the drain and the source of the amplifying transistor 5 via the reading transistor 6 and the resistance R.

Accordingly, as a result of selecting the value of the resistance R so that the current Vint_b/R becomes a desired value, it is possible to determine the gate voltage of the amplifying transistor 5 so that a current Ids_I that flows between the drain and the source of the amplifying transistor 5 becomes a state in which Ids_I=Vint_b/R.

After the gate voltage of the amplifying transistor 5 is initialized by the feedback control, the gate voltage of the amplifying transistor 5 is stored as an initial voltage value by turning the reset transistor 4 off.

In other words, as a result of the feedback of the amplifier 11, the initial voltage of the gate voltage of the amplifying transistor 5 is set so that the current Vint_b/R flows between the drain and the source of the amplifying transistor 5.

In the above-mentioned manner, when the initial voltage of the gate voltage of the amplifying transistor 5 is uniformly determined, the initial value of the current that flows between the drain and the source of the amplifying transistor 5 varies in a case where the threshold voltage and the mobility of the amplifying transistor 5 is varied. Therefore, it is not possible to accurately estimate the amperage between the drain and the source of the amplifying transistor 5, which fluctuates depending on the electrical signal from the sensor element 3. It is possible to correct variation in the initial current value by measuring the initial current value before radiation is incident on the active pixel 2 and subtracting the difference from a current after the radiation is incident on the active pixel 2. However, if the initial current value is large, flicker noise is increased, and there are also cases in which it is not possible to obtain a desired S/N ratio. On the other hand, if the initial current value is too small, the amplification factor of the amplifying transistor 5 is small, and therefore, there is a possibility that it will not possible to obtain a desired output signal.

[Radiation Sensing Operation]

In the radiation sensing operation, radiation is incident on the active pixel 2 from a state in which the gate voltage of the amplifying transistor 5 is reset. In the radiation sensing operation, in FIG. 1, the reset transistor 4 and the reading transistor 6 are turned off (the gate voltage is low in a case of an N-type transistor).

An electrical signal is generated in the sensor element 3 due to the incidence of radiation, and the electrical signal corresponding to the radiation dose of the radiation is accumulated in an electrostatic capacitance of the active pixel 2. As a result of this, the gate voltage of the amplifying transistor 5 changes from the initial voltage value. The electrical signal corresponding to the radiation dose of the radiation accumulated in the electrostatic capacitance of the active pixel 2 is amplified by using the amplifying transistor 5 as an amplification element, and is output to the source electrode of the reading transistor 6 as the output current.

[Reading Operation]

In the reading operation, the reset reading circuit 10 reads the output current value from the amplifying transistor 5. In the reading operation, in FIG. 1, the reset transistor 4 is turned off, and the reading transistor 6 is turned on (the gate voltage is high in a case of an N-type transistor).

When the reading transistor 6 is turned on in a state in which a current is flowing between the drain and the source of the amplifying transistor 5, the drain and the source of the reading transistor 6 are electrically connected. As a result of this, the current that flows between the drain and the source of the amplifying transistor 5 is output to the reset reading circuit 10, which is outside.

As a result of this, since the drain-source current of the amplifying transistor 5 is integrated in the capacitance Cf, if the time since the start of an integration operation is set as Ti, the output voltage of the amplifier 11 changes in accordance with the equation $Vo=-Ids \times Ti/Cf$. In this instance, Vo is the output voltage from the amplifier 11, and Ids is the current that flows between the drain and the source of the amplifying transistor 5. The output voltage Vo is proportionate to the current Ids. A changed portion due to the incidence of radiation can be calculated by using the equation $Vod=Vo-(-Ids\_I \times Ti/Cf)$.

In the reading operation, the changed portion from the initial value of the output current of the amplifying transistor 5 is integrated in the capacitance Cf by the feedback circuit 12, and a voltage proportionate to the changed portion of the output current is output to the output end of the amplifier 11.

In this instance, the reset reading circuit 10 is constantly connected to the active pixel 2, but since, other than during the reset operation, the reset transistor 4 is turned off, the voltage from the reset reading circuit 10 is not applied to the gate voltage of the amplifying transistor 5.

In addition, in the reading operation, since the resistance R is connected to the output end of the active pixel 2, the current flows to ground via the resistance R in the same manner as during the reset operation, and in the capacitance Cf, only the current of a fluctuated portion from the current during resetting is integrated. As a result of this, it is possible to increase the dynamic range of the output.

As a result of the above-mentioned operations, according to the radiation sensor 1 of the present embodiment, the bias voltage of the amplifying transistor 5 is determined so that an initial current becomes constant even if the threshold value of the amplifying transistor 5 used in each active pixel 2 fluctuates, and therefore, it is possible to output a current at the same amplification factor. Therefore, it is possible to prevent saturation as a result of the output current from the amplifying transistor 5 from being excessively high, and to prevent the non-detection of the current as a result of the amplification factor being excessively low. In this manner, in the present Embodiment 1, it is possible to realize both operations of initialization and reading of the active pixel 2 with a single amplifier 11.

[Circuit Area]

In the present embodiment, the reset reading circuit 10 performs (1) reading of the current value between the drain and the source of the amplifying transistor 5, which arises due to a change in the voltage of the gate electrode of the amplifying transistor 5 (a read operation), and (2) setting of the initial voltage of the voltage of the gate electrode of the amplifying transistor 5 using feedback control so that the current value between the drain and the source becomes a constant value that is determined in advance (a reset operation).

In this instance, in (1) and (2), it is possible to consider configuring circuits by providing dedicated amplifiers, but if the circuit configuration according to Embodiment 1 is used, it is possible to perform (1) and (2) without greatly increasing the circuit area by using only the reset reading circuit 10, which includes a single amplifier 11. As a result of this, it is possible to realize an increase in production cost and miniaturization of the device.

[Modification Example]

Figure 2:
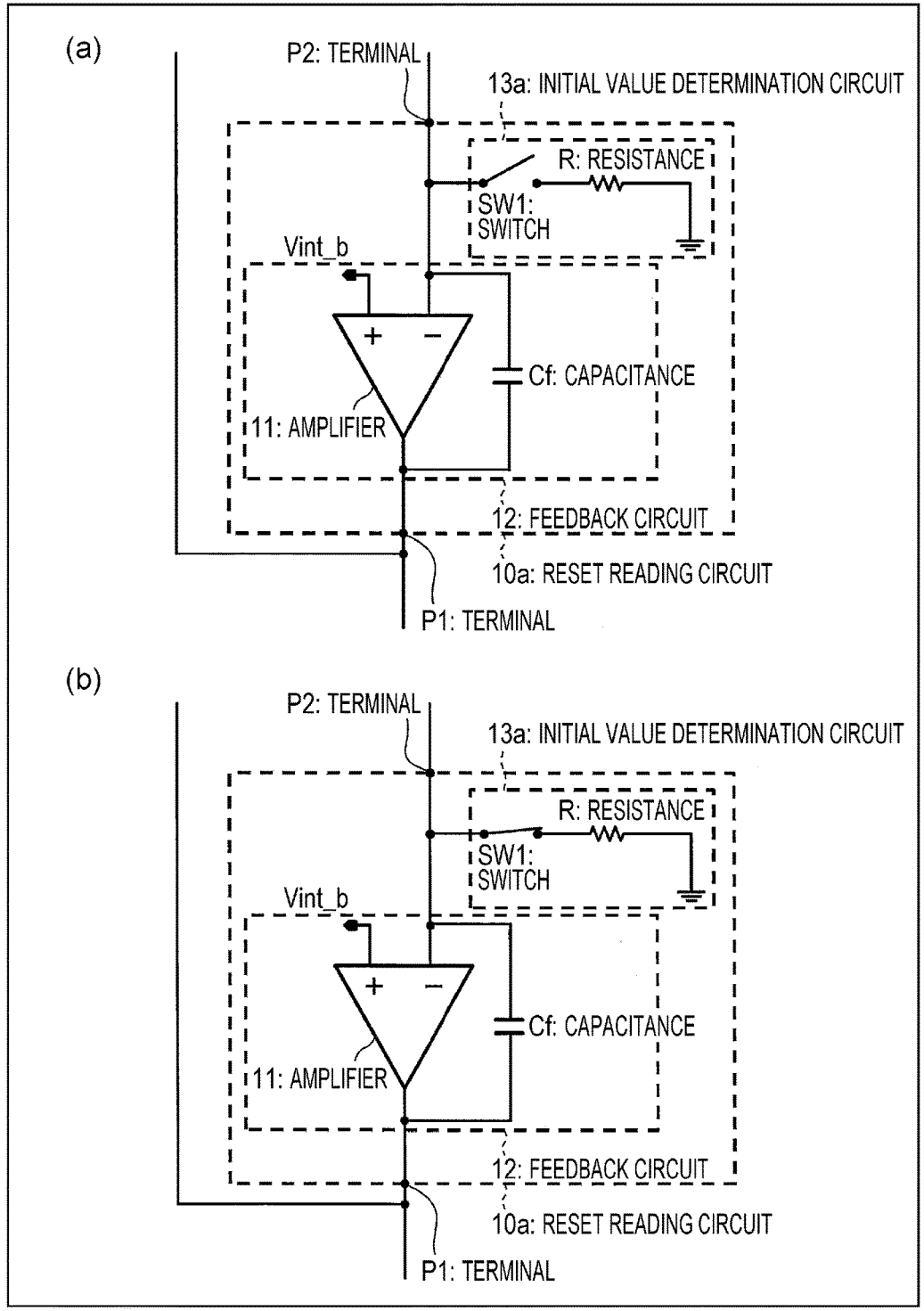
FIGS. 2(a) and 2(b) are views that illustrate schematic configurations of a reset reading circuit in a modification example of the radiation sensor.

Hereinafter, a modification example of Embodiment 1 of the present invention will be described with reference to FIG. 2. FIG. 2 includes views that illustrate schematic configurations of a reset reading circuit 10a in the modification example of the radiation sensor 1. FIG. 2(*a*) is the reset reading circuit 10a during the reading operation, and FIG. 2(*b*) is the reset reading circuit 10a during the reset operation.

[Reset Reading Circuit]

The reset reading circuit 10a shown in FIG. 2 differs from the reset reading circuit 10 in that an initial value determination circuit 13a is provided in place of the initial value determination circuit 13, and the other configurations thereof are similar.

The initial value determination circuit 13a includes a switch SW1 and the resistance R. The resistance R is connected to the minus side input terminal of the amplifier 11 via the switch SW1. An end portion opposite the resistance R of the switch SW1 is connected to ground.

[Reading and Reset Operations]

The switch SW1 is turned off during the reading operation as illustrated in FIG. 2(*a*), and is turned on during the reset operation as illustrated in FIG. 2(*b*). In other words, the reset reading circuit 10a includes the initial value determination circuit 13a, which includes at least one resistance R and determines a value of the current value that is determined in advance, and the initial value determination circuit 13a connects at least one resistance R and the amplifier 11 during an operation that outputs the initial voltage of the gate electrode of the amplifying transistor 5. As a result of this, since it is possible to isolate the resistance R from the circuit during the reading operation, it is possible to avoid a deterioration in the S/N that arises due to noise that the resistance R generates.

It is possible to realize so that the switch SW1 is controlled to be turned on when a feedback signal Fb is High, and turned off when the feedback signal Fb is Low. For example, the feedback signal Fb, which performs on/off control of the switch SW1, is generated in a control portion (not illustrated in the drawings) that supplies a clock signal, a start pulse signal, and the like, to a control signal generation circuit (not illustrated in the drawings) that generates a reading signal and a reset signal.

Embodiment 2

Figure 3:
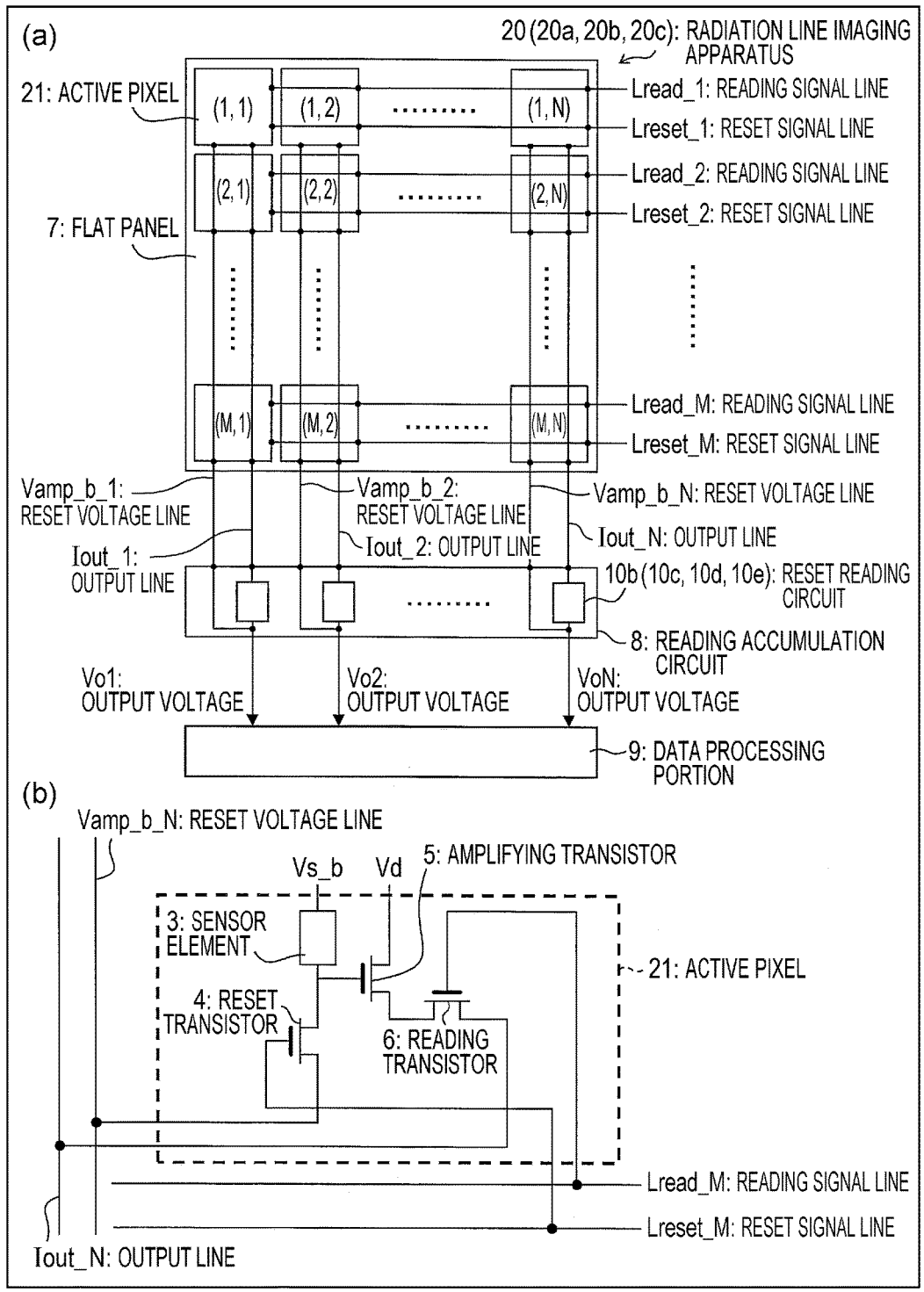
FIGS. 3(a) and 3(b) are views that illustrate a schematic configuration of a radiation image capturing device and a schematic circuit configuration inside an active pixel according to Embodiment 2 of the present invention.
Figure 4:
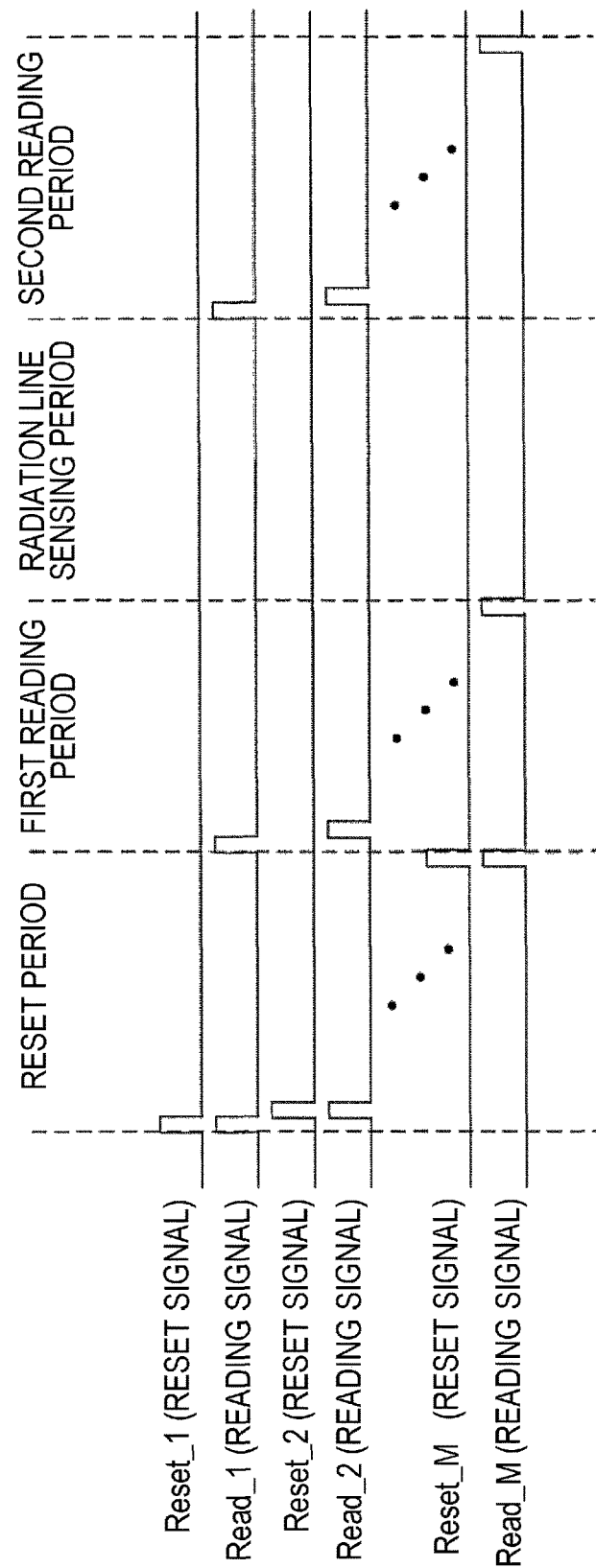
FIG. 4 is a view illustrating an example of a timing chart of a signal that drives the radiation image capturing device.
Figure 5:
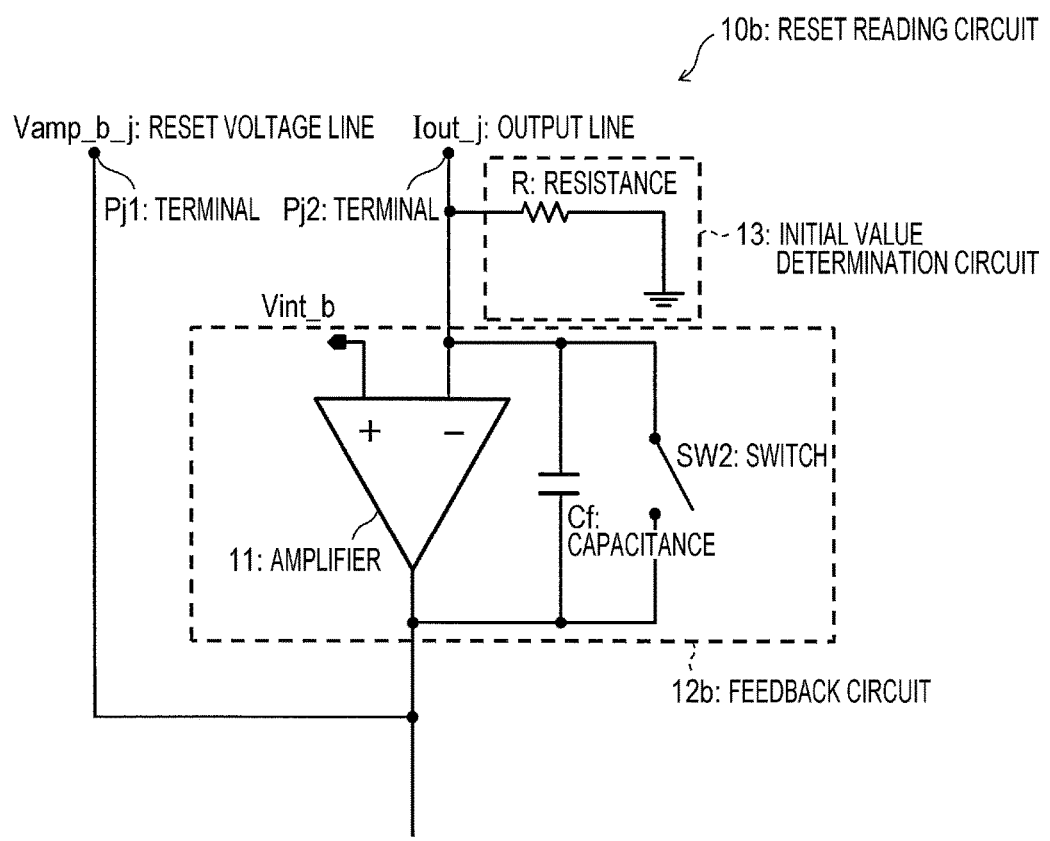
FIG. 5 is a view illustrating a schematic configuration of a reset reading circuit in the radiation image capturing device.

Embodiment 2 of the present invention will be described with reference to FIGS. 3 to 5. FIG. 3(*a*) is a view illustrating a schematic configuration of a radiation image capturing device 20 according to Embodiment 2 of the present invention. FIG. 3(*b*) is a view illustrating a schematic circuit configuration inside an active pixel 21. FIG. 4 is a view illustrating an example of a timing chart of a signal that drives the radiation image capturing device 20. FIG. 5 is a view illustrating a schematic configuration of a reset reading circuit 10b in the radiation image capturing device 20.

The radiation image capturing device 20 and reset reading circuit 10b in FIG. 3(*a*) are interchangeable with a radiation image capturing device 20a and a reset reading circuit 10c in Embodiment 3, a radiation image capturing device 20b and a reset reading circuit 10d in Embodiment 4, and a radiation image capturing device 20c and a reset reading circuit 10e in Embodiment 5.

The radiation image capturing device 20 differs from the radiation sensor 1 in that a plurality of the active pixels 21 are formed in matrix form, and a reset reading circuit 10b is provided for each column of active pixels 21 arranged in matrix form, and the other configurations thereof are similar.

[Schematic Configuration of Radiation Image Capturing Device]

As illustrated in FIG. 3(*a*), the radiation image capturing device 20 (a radiation detector) includes a plurality of active pixels 21, a flat panel 7, a reading integrated circuit 8, and a data processing portion 9.

The plurality of active pixels 21 (pixels) are disposed in the flat panel 7. More specifically, the active pixels 21 (pixels) are provided in the flat panel 7 in an M×N matrix form, and FIG. 3(*b*) illustrates a circuit configuration of an active pixel 21 of row M column N among the M×N active pixels 21. Since the configuration of each active pixel 21 is the same as the configuration of the active pixel 2 described in Embodiment 1, description thereof will be omitted.

In the radiation image capturing device 20, the reading signal line Lread and the reset signal line Lreset are shared for each row of M×N active pixels 21, and a reset voltage line Vamp_b and an output line Iout are shared for each column of M×N active pixels 21. Therefore, M reading signal lines Lread and reset signal lines Lreset, and N reset voltage lines Vamp_b and output lines Iout are provided.

Accordingly, as illustrated in FIG. 3(*b*), for example, in the active pixel 21 of row M column N, the gate electrode of the reset transistor 4 is connected to a reset signal line Lreset_M of row M, and the gate electrode of the reading transistor 6 is connected to a reading signal line Lread_M of row M.

Further, a reset voltage line Vamp_b_N of column N is connected to the gate electrode of the amplifying transistor 5 via the reset transistor 4, and an output line Iout_N of column N is connected to the drain electrode of the amplifying transistor 5 via the reading transistor 6.

The reading integrated circuit 8 includes N reset reading circuits 10b. The reading integrated circuit 8 performs (1) and (2) below by using the N reset reading circuits 10b. The reading integrated circuit 8 performs (1) reading of the current change between the drain and the source of the amplifying transistor 5 in each active pixel 21 and output of N output voltages Vo_1, Vo_2, . . . , Vo_N based on read currents to the data processing portion 9. (2) Output of an initial voltage to the gate voltage of the amplifying transistor 5 in each active pixel 21.

In a control signal generation circuit (not illustrated in the drawings) that generates a reading signal and a reset signal, as illustrated in FIG. 4, switching between (1) and (2) above is performed by using the states of the reading signal and the reset signal as a result of sequentially generating a signal in which the reading signal and the reset signal become High at the same time in a reset period (an operation period of (2) above), and sequentially generating a signal in which the reading signal becomes High is in a first reading period and a second reading period (operation periods of (1) above).

The data processing portion 9 can obtain a radiation imaging two-dimensional image having a resolution of M×N on the basis of the M×N output voltages. The N output voltages Vo_1, Vo_2, . . . , Vo_N output from the reset reading circuits 10b on a single occasion are input to the data processing portion 9.

[Reset Reading Circuit]

As illustrated in FIGS. 3 and 5, the reset reading circuits 10b differ from the reset reading circuit 10 in that the reset reading circuits 10b are provided in each of row of M×N active pixels 21 in the reading integrated circuit 8, and are provided with a feedback circuit 12b in place of the feedback circuit 12, and the other configurations thereof are similar.

The reset reading circuits 10b are provided with a terminal Pj1 ($1 \le j \le N$) for applying the initial voltage to the gate electrodes of the amplifying transistors 5 of each column of active pixels 21, and a terminal Pj2 ($1 \le j \le N$) for receiving the outputs from each column of active pixels 21 of the radiation image capturing device 20. The terminal Pj1 and the terminal Pj2 are respectively connected to the reset voltage line Vamp_b_j ($1 \le j \le N$) of column j and the output line Iout_j ($1 \le j \le N$) of column j.

The feedback circuit 12b differs from the feedback circuit 12 in that a switch SW2 is further provided, and the other configurations thereof are similar.

The switch SW2 is connected to the capacitance Cf in parallel, and discharges (initializes) an electric charge accumulated in the capacitance Cf to perform a reset. The reset reading circuits 10b obtain currents that are changed due to the incidence of radiation as a result of the current output from the active pixel 21 being integrated. However, it is necessary to initialize the capacitance Cf when starting integration.

As a result of turning on the switch SW2 and short-circuiting the capacitance Cf, the capacitance Cf is reset, and preparation for integration of the currents output from the active pixels 21 is complete. Since it is possible to initialize the capacitance Cf to a state of a constant output voltage by providing the switch SW2, the output voltage Vo of an integration result is accurately proportionate to the current.

In a case where there is not a switch SW2 and initialization of the capacitance Cf is not performed, it is possible to obtain a measurement value proportionate to the output current by measuring both the output voltage Vo of the amplifier 11 before integration and the output voltage Vo of the amplifier 11 after integration and subtracting the difference.

[Time Chart]

FIG. 4 is a view illustrating an example of a timing chart of a signal that drives the radiation image capturing device 20. As shown in FIG. 4, for example, a period (referred to as 1 frame period) in which a radiation imaging two-dimensional image having a resolution of M×N is acquired includes four phases of the reset period, the first reading period, a radiation sensing period, and the second reading period.

In the reset period, the gate voltage of each amplifying transistor 5 of the M×N active pixels 21 is initialized (reset) in order for each row. In other words, the radiation image capturing device 20 performs the reset operation of the active pixels 21.

In this period, the initial voltage is applied to the gate voltage of each amplifying transistor 5 of the active pixels 21 that belong to each row via the respective N reset voltage lines Vamp_b_j ($1 \le j \le N$) from the N reset reading circuits 10b.

More specifically, firstly, a reset signal Reset_1 and a reading signal Read_1 become High, and the reset transistor 4 and the reading transistor 6 in the active pixels 21 of row 1 are turned on. As a result of this, the initial voltage is output from the reset reading circuit 10b to the gate voltages of the amplifying transistors 5 in the active pixels 21 of row 1, and the gate voltages of the amplifying transistor 5 in the active pixels 21 of row 1 are initialized.

In addition, a reset signal Reset_2 and a reading signal Read_2 become High at a timing at which the reset signal Reset_1 and the reading signal Read_1 become Low, and the reset transistor 4 and the reading transistor 6 in the active pixels 21 of row 2 are turned on. As a result of this, the gate voltages of the amplifying transistors 5 in the active pixels 21 of row 2 are initialized.

In this manner, during the reset period, the gate voltages of each amplifying transistor 5 are sequentially initialized up to the active pixels 21 that belong to row M.

Next, in the first reading period, the initial current value that flows between the source electrode and the drain electrode of each amplifying transistor 5 of the M×N initialized active pixels 21 is sequentially read by the reset reading circuits 10b. In other words, the radiation image capturing device 20 performs a reading operation prior to an exposure period. In the first reading period, reading of the drain-source current of each amplifying transistor 5 is performed for each row of active pixels 21.

In this period, the N output voltages Vo_1, Vo_2, . . . , Vo_N are output to the data processing portion 9 from the N reset reading circuits 10b.

In the first reading period, reading signals Read_1, Read_2, . . . , and reading signal Read_M sequentially become High, and the reading transistors 6 in the active pixels 21 that belong to a corresponding row i ($1 \le i \le M$), are turned on.

As a result of this, the initial current value that flows between the drain and the source of each amplifying transistor 5 is read for each of the M×N initialized active pixels 21 as N output voltages Vo. The read N output voltages Vo are AD-converted and stored in a storage element (not illustrated in the drawings) provided in the data processing portion 9 as digital values. The first reading period is completed when reading is complete up to row M of the M×N active pixels 21.

Next, in the radiation sensing period (the exposure period), radiation is incident on the M×N active pixels 21 provided in the radiation image capturing device 20. An electrical signal generated corresponding to the incident radiation dose by the sensor element 3 provided in each active pixel 21 is accumulated in the electrostatic capacitance of each active pixel 21.

Lastly, in the second reading period, the current value, which is changed due to the incidence of radiation, that flows between the source electrode and the drain electrode of each amplifying transistor 5 of the M×N active pixels 21 is sequentially read by the reset reading circuits 10b. In other words, the radiation image capturing device 20 performs a reading operation following the exposure period. In the second reading period, reading of the drain-source current of each amplifying transistor 5 is performed for each row of active pixels 21.

In this period, the N output voltages Vo_1, Vo_2, ..., Vo_N are output to the data processing portion 9 from the N reset reading circuits 10b.

In the second reading period, reading signals Read_1, Read_2, ..., and reading signal Read_M sequentially become High, and the reading transistors 6 in the active pixels 21 that belong to a corresponding row i (1≤i≤M), are turned on.

As a result of this, the current value that flows between the drain and the source of each amplifying transistor 5 is read for each of the M×N active pixels 21 as N output voltages Vo by the reset reading circuits 10b. The N read output voltages Vo can be acquired as digital values through AD conversion. Furthermore, in the data processing portion 9, it is possible to acquire changed portions of the currents from before radiation was incident as signals by subtracting the output voltages Vo that correspond to the initial current value, which are stored in the storage element (not illustrated in the drawings) of the data processing portion 9 in the first reading period from the output voltages Vo acquired as the second reading period values.

The second reading period is completed when reading is complete up to row M of the M×N active pixels 21.

In the present embodiment, description is given including a case in which a single frame period is configured by the reset period, the first reading period, the radiation sensing period, and the second reading period and all of the periods are repeated in each frame, as an example, but the invention is not limited to this configuration. For example, the reset period may be included once in a plurality of frames, and it is possible to use a reading result of the second reading period of a previous frame without providing the first reading period. In addition, it is possible to combine the radiation sensing period with another period without explicitly providing the radiation sensing period in a separate manner.

In addition, it is possible to determine the initial value of integration (to initialize the capacitance Cf) by turning on the switch SW2 illustrated in FIG. 5 only for a short period of time at the beginning of the first reading period. Other than during the short period of time at the beginning of the first reading period, the switch SW2 is turned off. As a result of this, it is possible to not provide the first reading period, and to acquire the changed portions of the current from before radiation is incident as signals using only the reading results of the second reading period. In other words, in a case where the first reading period and the second reading period are provided, it is possible to acquire the changed portions of the current from before radiation is incident as signals even if the switch SW2 is not present by measuring the difference in the output voltages before and after integration.

The flat panel 7 may be a semiconductor substrate, or the like, and in such a case, it is possible to form each circuit directly on the semiconductor substrate.

Embodiment 3

Figure 6:
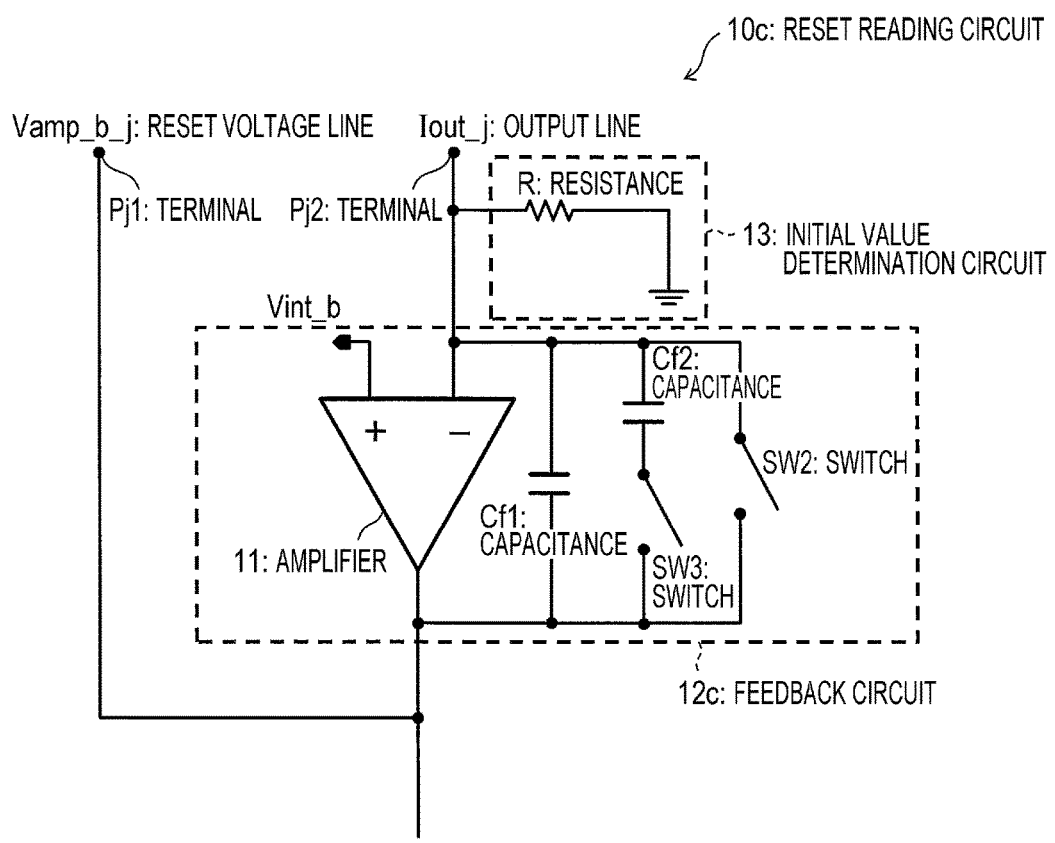
FIG. 6 is a view illustrating a schematic configuration of a reset reading circuit in a radiation image capturing device according to Embodiment 3 of the present invention.

Embodiment 3 of the present invention will be described with reference to FIG. 6. FIG. 6 is a view illustrating a schematic configuration of a reset reading circuit 10c in the radiation image capturing device 20a according to Embodiment 3 of the present invention. The radiation image capturing device 20a (refer to FIG. 3(a)) differs from the radiation image capturing device 20 in that reset reading circuits 10c are provided in place of the reset reading circuits 10b, and the other configurations thereof are similar.

[Reset Reading Circuit]

The reset reading circuits 10c are different in that a feedback circuit 12c is provided in place of the feedback circuit 12b, and the other configurations thereof are similar.

The feedback circuit 12c differs from the feedback circuit 12b in that a capacitance Cf1, a capacitance Cf2, and a switch SW3 are provided in place of the capacitance Cf, and the other configurations thereof are similar.

The feedback circuit 12c alters the capacitances connected between one input terminal of the amplifier 11 and the output terminal of the amplifier 11 when the reset reading circuits 10c switches between the reading operation and the reset operation. For example, this alteration switches the capacitance connected to the amplifier 11 from the capacitance Cf1 to the capacitance Cf1+ the capacitance Cf2 between the reset period, and the first reading period and the second reading period illustrated in FIG. 4 by using the switch SW3.

The gain of reading is determined by using a feedback capacitance during reading of the output current from the amplifying transistor 5. Therefore, it is necessary to select a suitable feedback capacitance in a relationship with a reading time. Meanwhile, it is necessary to select the feedback capacitance so that the feedback is stable during setting of the initial voltage of the gate voltage of the amplifying transistor 5. According to the present embodiment, even in a case where the capacitance that satisfies these two requirements is different, it is possible to set a suitable capacitance by switching the capacitance.

[Capacitance Switching Operation]

In the reset period, the switch SW3 is turned off, and the switch SW2 is turned off. When the switch SW3 is off, the feedback capacitance in the feedback circuit 12c is the capacitance Cf1. In the reading periods (the first reading period and the second reading period), the switch SW3 is turned on, and the switch SW2 is turned on for a short period at the beginning of the reading periods and is turned off at other times. When the switch SW3 is on, the feedback capacitance is the capacitance Cf1+ the capacitance Cf2.

As a result of this, in the reset period, it is possible to decrease the feedback capacitance in a range at which feedback does not become unstable, and therefore, it is possible for the feedback to be focused in a short period.

In addition, as a result of the switch SW2 being turned on for a short time at the beginning of the reading periods, it is possible to short-circuit the capacitance Cf to initialize the accumulated current from the integrated amplifying transistor 5.

Embodiment 4

Figure 7:
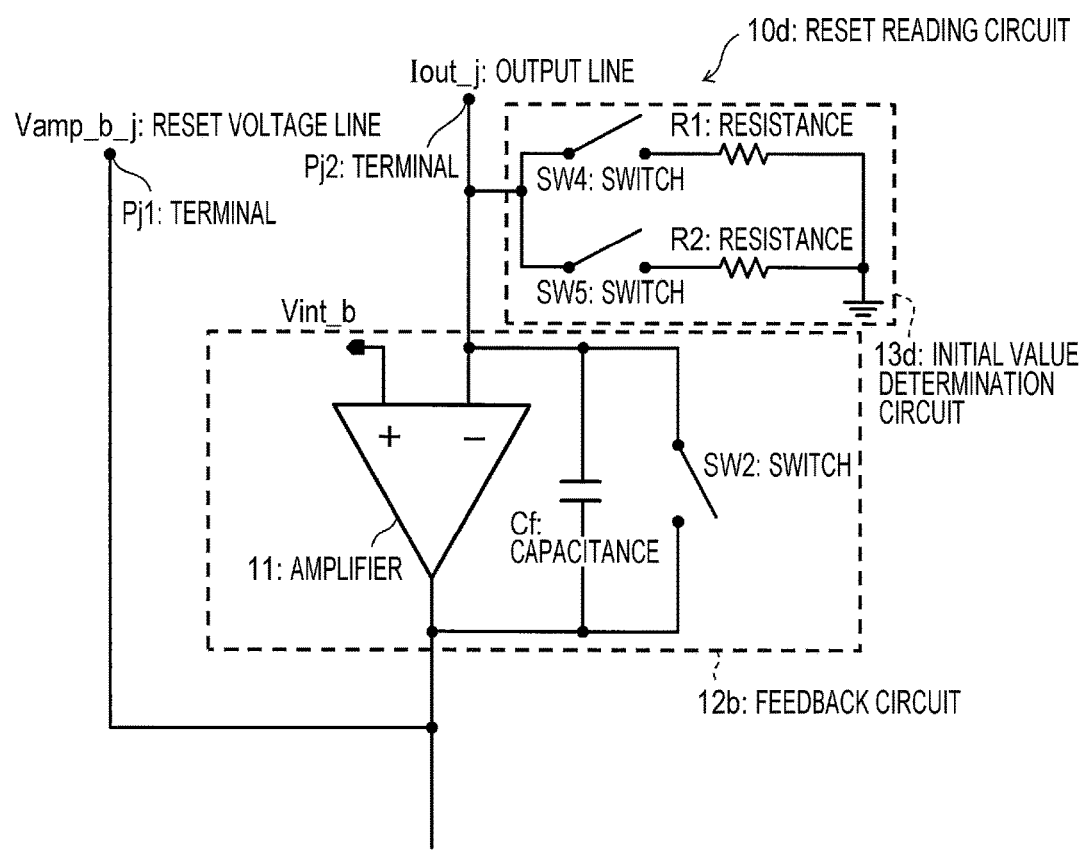
FIG. 7 is a view illustrating a schematic configuration of a reset reading circuit in a radiation image capturing device according to Embodiment 4 of the present invention.

Embodiment 4 of the present invention will be described with reference to FIG. 7. FIG. 7 is a view illustrating a schematic configuration of a reset reading circuit 10d in the radiation image capturing device 20b according to Embodiment 4 of the present invention. The radiation image capturing device 20b (refer to FIG. 3(a)) differs from the radiation image capturing device 20 in that reset reading circuits 10d are provided in place of the reset reading circuits 10b, and the other configurations thereof are similar.

[Reset Reading Circuit]

The reset reading circuits 10d differ from the reset reading circuits 10b in that an initial value determination circuit 13d is provided in place of the initial value determination circuit 13, and the other configurations thereof are similar.

The initial value determination circuit 13d differs from the initial value determination circuit 13 in that a resistance R1, a resistance R2, a switch SW4, and a switch SW5 are provided in place of the resistance R, and the other configurations thereof are similar.

In the initial value determination circuit 13d, a plurality of values (initial values), which are determined in advance, of the current value that flows between the source electrode and the drain electrode of the amplifying transistor 5 are provided, and the initial value of the current value that flows between the source electrode and the drain electrode of the amplifying transistor 5 is selected.

For example, in the reset period illustrated in FIG. 4, the initial value determination circuit 13d selects an initial value of a target current from among two initial values Vint_b/R1 and Vint_b/R2.

In a case where the mobility of the amplifying transistor 5 is decreased by aging, when initialization of the gate voltage of the amplifying transistor 5 is performed with a current value set as a target that is the same value before aging, the degree of amplification of the amplifying transistor 5 is reduced. In contrast to this, as a result of configuring so that it is possible to select a target value (an initial value) that includes an initially large current value, even in a case where the mobility is decreased by aging, it is possible to correct a reduction in the degree of amplification by altering the target value to the large current value, and therefore, it is possible to prevent a reduction in the degree of amplification.

The number of resistances connected to the initial value determination circuit 13d, that is, the selectable number of target values of the current is not particularly limited, and can be increased as appropriate in consideration of the circuit area.

A user may perform switching of the resistance R1 and the resistance R2 (turning on and off of the switch SW4 and the switch SW5) externally. In addition, the switching may be performed automatically as a result of a device provided with the radiation image capturing device 20b monitoring the gate voltage of the amplifying transistor 5 during the reset operation.

In this case, the circuit that measures the gate voltage of the amplifying transistor 5 during the reset operation is built into the device, and it is determined whether the mobility of the amplifying transistor 5 has deteriorated when the gate voltage of the amplifying transistor 5 becomes higher than a predetermined value. When it is determined that the mobility has deteriorated, the circuit alters the target value of the current by switching the resistance as a result of switching the SW4 and the SW5.

Embodiment 5

Figure 8:
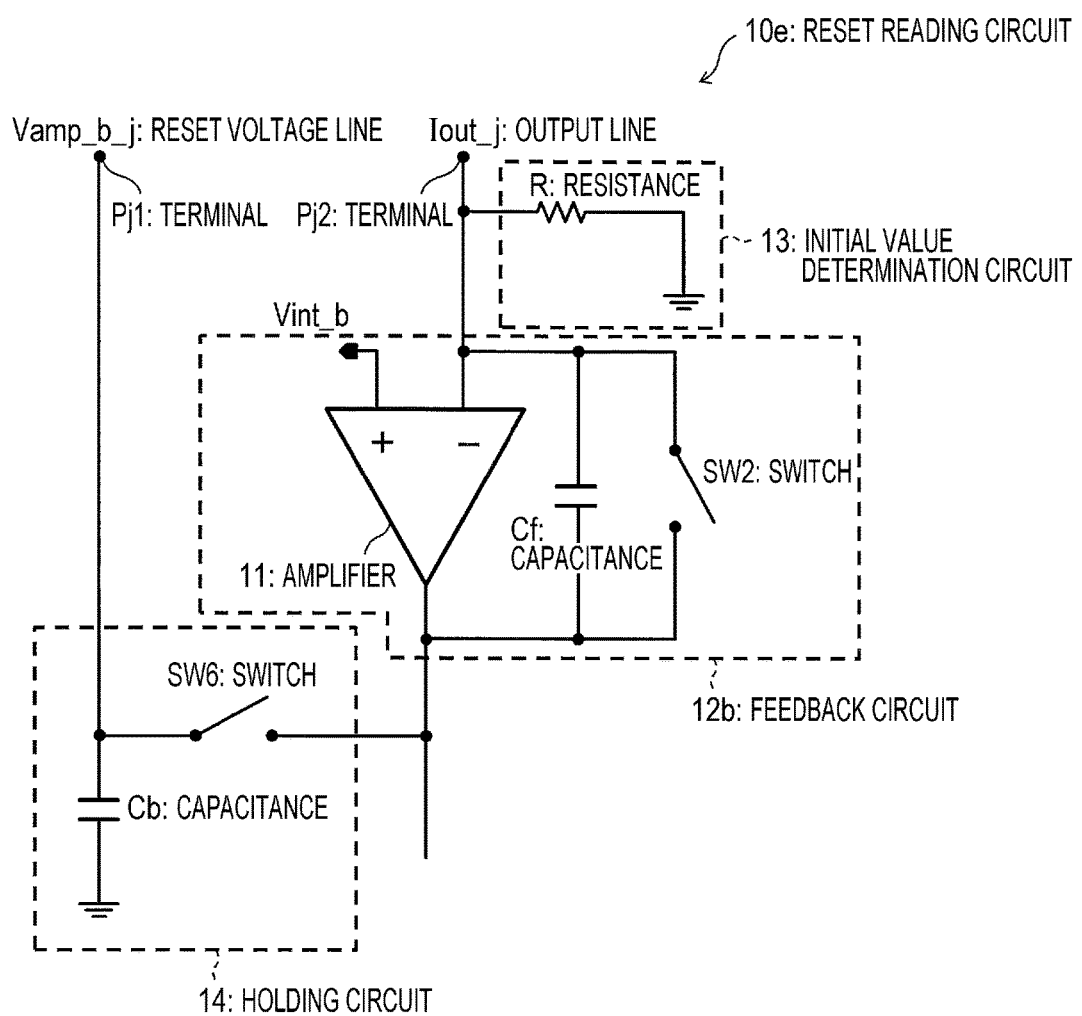
FIG. 8 is a view illustrating a schematic configuration of a reset reading circuit in a radiation image capturing device according to Embodiment 5 of the present invention.
Figure 9:
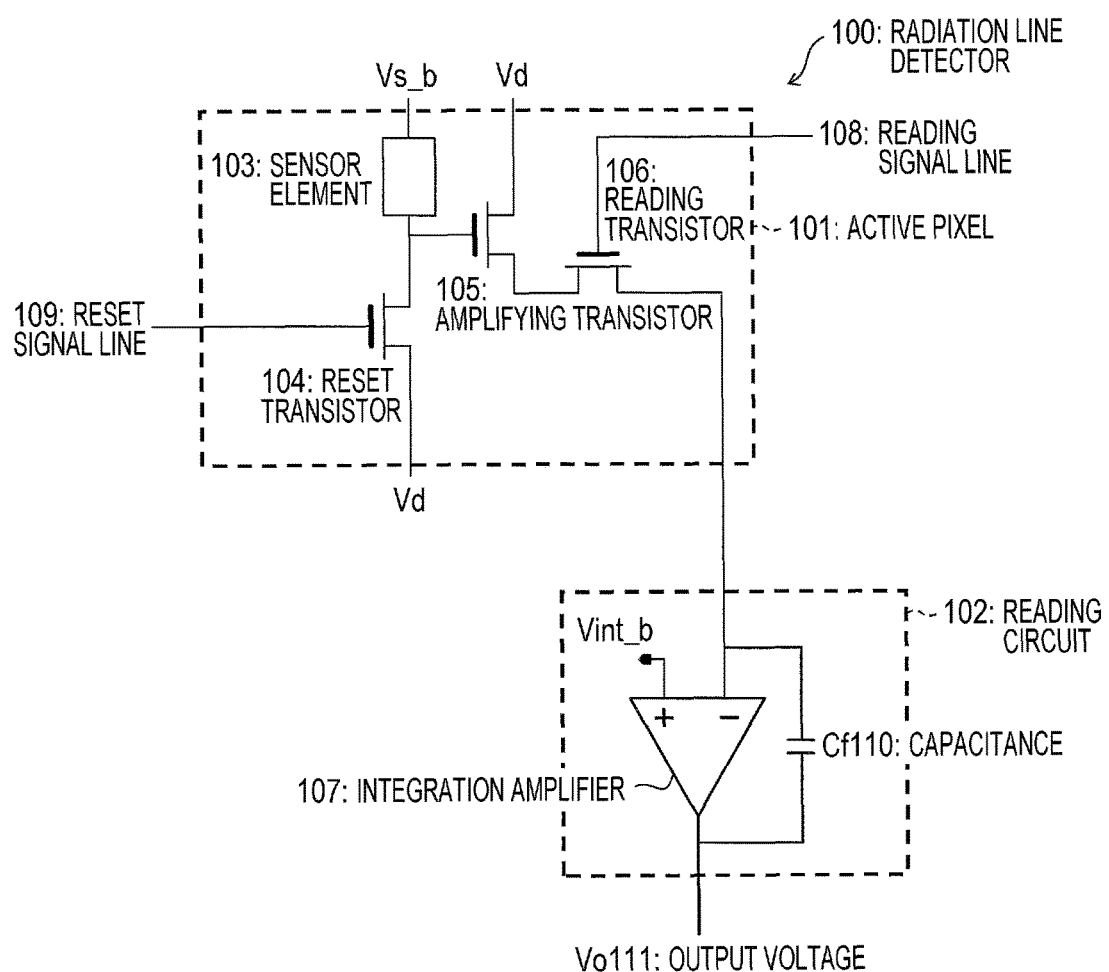
FIG. 9 is a view illustrating an example of an active pixel and a reading circuit provided in an active pixel type radiation detector of the related art.

Embodiment 5 of the present invention will be described with reference to FIG. 8. FIG. 8 is a view illustrating a schematic configuration of a reset reading circuit 10e in the radiation image capturing device 20c according to Embodiment 5 of the present invention. The radiation image capturing device 20c (refer to FIG. 3(a)) differs from the radiation image capturing device 20 in that reset reading circuits 10e are provided in place of the reset reading circuits 10b, and the other configurations thereof are similar.

[Reset Reading Circuit]

The reset reading circuits 10e differ from the reset reading circuits 10b in that a storage circuit 14 is further provided, and the other configurations thereof are similar.

[Storage Circuit]

The storage circuit 14 stores a voltage applied to a reset voltage line Vamp_b_j from the amplifier 11 in a capacitance Cb in the reset period (the reset operation).

The storage circuit 14 includes a switch SW6, and the capacitance Cb (the storage capacitance), which is connected to the output terminal of the amplifier 11 via the switch SW6.

In the storage circuit 14, the switch SW6 is turned on in the reset period, and the switch SW6 is turned off in the reading periods. As a result of the switch SW6 being turned off at times other than during the reset period, the initial voltage is stored in the capacitance Cb at times other than during an operation time that outputs the initial voltage of the gate electrode. In other words, the storage circuit 14 is configured so as to store the voltage output from the terminal that sets the initial voltage of the voltage of the gate electrode of the amplifying transistor 5 in the capacitance Cb at times other than the reset period. As a result of this, a circumstance in which the output of the amplifier 11 changes the voltage stored in the capacitance Cb is prevented.

In addition, as a result of this circuit configuration, a voltage that is close to the voltage applied to the gate electrode of the amplifying transistor 5 from the amplifier 11 during the reset period is even applied to the reset voltage line Vamp_b_j at times other than the reset period. Therefore, since the difference in potential between both ends of the reset transistor 4 is small when the reset transistor 4 is off, it is possible to prevent a circumstance in which the gate voltage of the amplifying transistor 5 fluctuates due to leakage of the reset transistor 4.

[Conclusion]

The radiation detector (the radiation sensor 1, and the radiation image capturing devices 20, 20a, 20b, and 20c) according to Aspect 1 of the present invention includes the sensor element (3) that causes an electrical signal to be generated based on a radiation dose of incident radiation and the amplifying transistor (5) that amplifies the electrical signal, and is a radiation detector that reads a current value that flows between the source electrode and the drain electrode of the amplifying transistor based on a change, due to the electrical signal, in voltage of the gate electrode of the amplifying transistor and also includes the reset reading circuit (10, 10a, 10b, 10c, 10d, and 10e) that includes the amplifier (11) and reads the current value using the amplifier, and the reset reading circuit outputs the initial voltage to the gate electrode so that the current value becomes a value that is determined in advance.

According to the above-mentioned configuration, in the gate electrode, the voltage from the reset reading circuit is output so that the current value becomes a value that is determined in advance (reset operation).

Therefore, even in a case where the threshold voltage and the mobility of the amplifying transistor is varied, the reset reading circuit can be configured so that the current value that flows between the source electrode and the drain electrode of the amplifying transistor becomes a value that is determined in advance. As a result of this, even in the above-mentioned case, it is possible to set the initial current value that flows between the source electrode and the drain electrode of the amplifying transistor to within an appropriate range, and therefore, it is possible to realize a radiation detector that can obtain an output signal in which a desired S/N ratio is maintained.

In addition, the current value that flows between the source electrode and the drain electrode of the amplifying transistor is read by the reset reading circuit (read operation). Therefore, the radiation detector can perform the reset operation and the read operation by using a single amplifier. As a result of this, it is possible to realize a radiation detector in which the reset operation and the read operation are possible without greatly increasing the circuit area.

In Aspect 1, in the radiation detector (the radiation sensor 1, and the radiation image capturing devices 20, 20a, 20b, and 20c) according to Aspect 2 of the present invention, the output of the amplifier (11) is fed back to one input terminal of the amplifier, and the initial voltage may be generated as a result of the feedback.

According to the above-mentioned configuration, the initial voltage is generated as a result of the output from the amplifier being feedback controlled. Therefore, for example, the reset reading circuit can generate the initial voltage using a capacitance used in the reading operation, and therefore, can perform the reset operation. As a result of this, it is possible for the reset reading circuit to perform the reset operation and the read operation by using a single amplifier. Therefore, it is possible to realize a radiation detector in which the reset operation and the read operation are possible without greatly increasing the circuit area.

In Aspect 1 or 2, in the radiation detector (the radiation image capturing devices 20, 20a, 20b, and 20c) according to Aspect 3 of the present invention, a plurality of pixels each provided with the sensor element (3) and the amplifying transistor (5) may be disposed in matrix form.

According to the above-mentioned configuration, in the radiation detector, a plurality of pixels each provided with the sensor element and the amplifying transistor are disposed in matrix form. Therefore, the radiation detector can, for example, obtain a radiation imaging two-dimensional image by reading the electrical signals of the plurality of pixels.

In any one of Aspects 1 to 3, in the radiation detector (the radiation image capturing device 20a) according to Aspect 4 of the present invention, when switching between an operation that reads the current value and an operation that outputs the initial voltage of the gate electrode, the reset reading circuit (10c) alters a feedback capacitance (the capacitances Cf1 and Cf2) connected between the one input terminal of the amplifier (11) and the output terminal of the amplifier.

According to the above-mentioned configuration, in the reset reading circuit, when an operation that reads the current value and an operation that outputs the initial voltage of the gate electrode are switched, a feedback capacitance connected between the one input terminal of the amplifier and the output terminal of the amplifier is altered. In other words, since it is possible to alter the capacitance of the feedback circuit depending on each operation, it is possible to set a suitable feedback capacitance for an operation that reads a current value and an operation that outputs the initial voltage of the gate electrode.

In any one of Aspects 1 to 4, in the radiation detector (the radiation image capturing device 20b) according to Aspect 5 of the present invention, a plurality of values (the resistance R1 and R2) of the current value that is determined in advance may be provided and a value may be selected from among the plurality.

According to the above-mentioned configuration, it is possible to select a value of the current that is determined in advance from among a plurality of values. Therefore, in a case where an optimum initial voltage has changed due to aging, it is possible to set an optimum initial voltage again.

In any one of Aspects 1 to 5, in the radiation detector (the radiation image capturing device 20c) according to Aspect 6 of the present invention, the reset reading circuit (10e) includes a storage capacitance (capacitance Cb) connected to an output terminal of the amplifier (11), and the storage capacitance stores the initial voltage.

According to the above-mentioned configuration, the initial voltage is stored in the storage capacitance connected to the output terminal of the amplifier. As a result of this, a voltage that is close to the initial voltage is even applied to the active pixels at times other than during the operation that outputs the initial voltage. As a result of this, it is possible to prevent fluctuations in the current output from the active pixels.

In aspect 1, in the radiation detector (the radiation sensor 1) according to Aspect 7 of the present invention, the reset reading circuit (10) may be provided with an initial value determination circuit (13) that includes at least one resistance and determines a value of the current value that is determined in advance, and the initial value determination circuit may be connected to the at least one resistance and the amplifier (11) during the operation that outputs the initial voltage determination circuit of the gate electrode.

According to the above-mentioned configuration, the initial value determination circuit, which determines the value of the current value that is determined in advance, is connected to the amplifier during the operation that outputs the initial voltage of the gate electrode, and is not connected to the amplifier during the operation that reads the current value. As a result of this, since it is possible to isolate the resistance from the reset reading circuit during the operation that reads the current value, it is possible to avoid a deterioration in the S/N that arises due to noise that the resistance generates.

The present invention is not limited to each of the embodiments mentioned above, various modifications are possible within a range that is shown in the claims, and embodiments obtained by combining technical means that are respectively disclosed in different embodiments as appropriate, are also included in the technical scope of the present invention. Furthermore, it is possible to form new technical features by combining technical means that are respectively disclosed in each embodiment.

INDUSTRIAL APPLICABILITY

The present invention can be suitably used in a radiation sensor and a radiation image capturing device, and in particular, in a device that uses radiation.

REFERENCE SIGNS LIST

1 RADIATION SENSOR (RADIATION DETECTOR)
3 SENSOR ELEMENT
5 AMPLIFYING TRANSISTOR
10, 10a, 10b, 10c, 10d, 10e RESET READING CIRCUIT
11 AMPLIFIER
20, 20a, 20b RADIATION IMAGE CAPTURING DEVICE (RADIATION DETECTOR)
Cf1, Cf2 CAPACITANCE (FEEDBACK CAPACITANCE)
Cb CAPACITANCE (STORAGE CAPACITANCE)

The invention claimed is:
1. A radiation detector comprising:
a sensor element that causes an electrical signal to be generated based on a radiation dose of incident radiation;

an amplifying transistor that amplifies the electrical signal, the radiation detector reading a current value that flows between a source electrode and a drain electrode of the amplifying transistor based on a change, due to the electrical signal, in voltage of a gate electrode of the amplifying transistor; and a reset reading circuit that includes an amplifier and reads the current value using the amplifier, wherein the reset reading circuit outputs an initial voltage to the gate electrode so that the current value becomes a value that is determined in advance.

2. The radiation detector according to claim 1, wherein the output of the amplifier is fed back to one input terminal of the amplifier, and the initial voltage is generated as a result of the feedback.

3. The radiation detector according to claim 2, wherein a plurality of pixels each provided with the sensor element and the amplifying transistor are disposed in matrix form.

4. The radiation detector according to claim 1, wherein a plurality of pixels each provided with the sensor element and the amplifying transistor are disposed in matrix form.

5. The radiation detector according to claim 1, wherein, when switching between an operation that reads the current value and an operation that outputs the initial voltage of the gate electrode, the reset reading circuit alters a feedback capacitance connected between one input terminal of the amplifier and an output terminal of the amplifier.

6. The radiation detector according to claim 1, wherein the reset reading circuit includes a storage capacitance connected to an output terminal of the amplifier, and the storage capacitance stores the initial voltage.

* * * * *